United States Patent
Chen et al.

(10) Patent No.: US 9,036,410 B2
(45) Date of Patent: *May 19, 2015

(54) Y-DECODER AND DECODING METHOD THEREOF

(75) Inventors: Chung-Kuang Chen, Pan Chiao (TW); Han-Sung Chen, Hsinchu (TW); Chun-Hsiung Hung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 577 days.

This patent is subject to a terminal disclaimer.

(21) Appl. No.: 13/013,592

(22) Filed: Jan. 25, 2011

(65) Prior Publication Data

US 2011/0122721 A1    May 26, 2011

Related U.S. Application Data

(63) Continuation of application No. 12/205,279, filed on Sep. 5, 2008, now Pat. No. 7,903,498.

(51) Int. Cl.
  *G11C 11/34* (2006.01)
  *G11C 16/06* (2006.01)
  *G11C 8/10* (2006.01)

(52) U.S. Cl.
  CPC .................................. *G11C 8/10* (2013.01)

(58) Field of Classification Search
  USPC .................. 365/230.06, 226, 230.03, 230.02, 365/185.19, 185.22, 189.07, 185.13, 365/185.02, 185.18, 189.15, 206, 23–23.02
  See application file for complete search history.

(56) References Cited

U.S. PATENT DOCUMENTS

| | | | | |
|---|---|---|---|---|
| 6,278,649 B1 * | 8/2001 | Lee et al. | ................. | 365/230.03 |
| 6,487,124 B2 * | 11/2002 | Semi | ...................... | 365/185.25 |
| 6,496,405 B2 * | 12/2002 | Hibino | ......................... | 365/104 |
| 6,525,969 B1 * | 2/2003 | Kurihara et al. | ......... | 365/185.25 |
| 6,914,824 B2 * | 7/2005 | Yamashita et al. | ....... | 365/185.25 |
| 7,218,563 B1 * | 5/2007 | Lin et al. | ...................... | 365/203 |
| 7,477,551 B2 | 1/2009 | Avramescu et al. | | |
| 7,881,121 B2 * | 2/2011 | Kim et al. | ................ | 365/185.25 |
| 7,903,498 B2 * | 3/2011 | Chen et al. | ............... | 365/230.06 |
| 8,400,841 B2 * | 3/2013 | Maayan | ................... | 365/185.28 |
| 2002/0176310 A1 * | 11/2002 | Hilbert | ..................... | 365/230.06 |
| 2008/0130375 A1 | 6/2008 | Raghavan et al. | | |
| 2009/0310418 A1 * | 12/2009 | Cernea | ..................... | 365/185.19 |

* cited by examiner

*Primary Examiner* — Vanthu Nguyen
(74) *Attorney, Agent, or Firm* — McClure, Qualey & Rodack, LLP

(57) ABSTRACT

A Y-decoder includes a selection unit and a Y-MUX. The selection unit is coupled to the memory array for selecting the column lines. The Y-MUX is coupled to the selection unit for supplying a voltage to the selected column line. The Y-MUX includes a first switch, a second switch, a third switch and a fourth switch coupled in parallel. The first switch and the second switch are respectively for receiving a first shielding voltage and a second shielding voltage. The third switch and the fourth switch are respectively for receiving a first sensing voltage and a second sensing voltage.

16 Claims, 5 Drawing Sheets

Y-DECODER AND DECODING METHOD THEREOF

This application is a continuation application of application Ser. No. 12/205,279, filed on Sep. 5, 2008, now U.S. Pat. No. 7,903,498, the contents of which are incorporated herein by reference.

BACKGROUND OF THE INVENTION

1. Field of the Invention

The invention relates in general to a Y-decoder and decoding method thereof, and more particularly to a Y-decoder, which supplies a first sensing voltage to a memory cell to be read on a memory array and successively supplies a second sensing voltage and a shielding voltage, both equal to the first sensing voltage, to the next two memory cells on the same row, and decoding method thereof.

2. Description of the Related Art

Memory devices are known in the art for storing data in a wide variety of electronic devices and applications. A typical memory device includes a number of memory cells. Often, memory cells are arranged in an array format, where a row of memory cells corresponds to a word line and a column of memory cells corresponds to a column line. Typically, the state of a memory cell is determined during a read operation by sensing the current drawn by the memory cell.

FIG. 1 is a schematic diagram of a sensing algorithm of memory cells in a conventional non-volatile memory. In FIG. 1, only one row of memory cells in one memory bank is shown for illustration convenience and each memory cell includes two bits. For example, to ascertain the current drawn by a particular memory cell A3 (specifically, the left bit of the memory cell A3), the bank-select metal oxide semiconductor (MOS) transistor sel2 is turned on to select the column line CL2 and supply a ground voltage G to the source of the memory cell A3 via the metal bit line MBL2 and the column line CL2. At the same time, the bank-select MOS transistor sel3 is turned on to select the column line CL3 and supply a sensing voltage (or drain voltage) D1 to the drain of the memory cell A3 via the metal bit line MBL3 and the column line CL3.

Typically, due to an array effect, a by-pass current Ib will flow by the next memory cell A4 and result in a smaller and incorrect sensing current Is flowing to a sense amplifier (not shown) via the metal bit line MBL3. In order to reduce the by-pass current Ib such that the sensing current Is of the sense amplifier can be closer to the cell current Ic of the memory cell A3, the bank-select MOS transistor sel4 is simultaneously turned on to select the column line CL4 and supply a shielding voltage S1, which is substantially equal to the sensing voltage D1, to the drain of the next memory cell A4 via the metal bit line MBL0 and the column line CL4, and the drains of the following memory cells A5, A6, . . . are all controlled to float (F).

However, in practical circuit design, it is difficult to supply the shielding voltage S1 having a value very close to the sensing voltage D1 due to inherent circuit coupling and interference. As a result, an amount of bypass current Ib (about 15% of the cell current Ic) still occurs to make the sensing current Is smaller than the cell current Ic (only 85% of the cell current Ic), thereby narrowing the cell operating window and reducing the cell program speed of the non-volatile memory.

SUMMARY OF THE INVENTION

The invention is directed to a Y-decoder and decoding method thereof. By supplying a first sensing voltage to the memory cell to be read, successively supplying a second sensing voltage and a shielding voltage, both equal to the first sensing voltage, to the next two memory cells on the same row, allowing at least one following memory cell to float and supplying a second shielding voltage, equal to the first shielding voltage, to the memory cell next to the at least one following memory cell in a read operation, the array effect can be cancelled to widen the cell operating window and increase the cell program speed of the memory.

According to a first aspect of the present invention, a Y-decoder is provided. The Y-decoder is applied in a memory including a memory array. The memory array includes a number of memory cells and a number of column lines coupled to the memory cells. The column lines include a first column line, a second column line, a third column line and a fourth column line arranged successively from the first to the fourth column line, and a fifth column line spacing from the fourth column with at least one column line. The Y-decoder includes a selection unit and a Y-multiplexer (Y-MUX). The selection unit is coupled to the memory array for selecting the column lines. The Y-MUX is coupled to the selection unit for supplying a voltage to the selected column line. The Y-MUX includes a first switch, a second switch, a third switch and a fourth switch coupled in parallel, wherein the first switch and the second switch are respectively for receiving a first shielding voltage and a second shielding voltage, the third switch and the fourth switch are respectively for receiving a first sensing voltage and a second sensing voltage.

The Y-decoder selects and supplies the first column line with a ground voltage, selects and supplies the second column line with the first sensing voltage by turning on the corresponding third switch, selects and supplies the third column line with the second sensing voltage by turning on the corresponding fourth switch, selects and supplies the fourth column line with the first shielding voltage by turning on the corresponding first switch, allows the at least one column line to float, and selects and supplies the fifth column line with the second shielding voltage by turning on the corresponding second switch.

According to a second aspect of the present invention, a Y-decoder is provided. The Y-decoder is applied in a memory including a memory array and the memory array includes a number of memory cells. The Y-decoder includes a first column line, a second column line, a third column line and a fourth column line arranged successively from the first to the fourth column line, and a fifth column line spacing from the fourth column line with at least one column line. The first column line is coupled to a target cell. When the target cell is to be read, the Y-decoder selects and supplies the first column line with a ground voltage, selects and supplies the second column line with a first sensing voltage, selects and supplies the third column line with a second sensing voltage, selects and supplies the fourth column line with a first shielding voltage, allows the at least one column line to float, and selects and supplies the fifth column line with a second shielding voltage.

According to a third aspect of the present invention, a Y-decoder is provided. The Y-decoder is applied in a memory including a memory array. The memory array includes a number of memory cells and a number of column lines coupled to the memory cells. The Y-decoder includes a number of bit-line groups and a Y-MUX. The bit-line groups are coupled to the column lines, and each bit-line group includes a number of bit lines. The Y-MUX is coupled to the bit-line groups for supplying a voltage to the selected column line. The Y-MUX includes a first switch, a second switch, a third switch and a fourth switch coupled in parallel to each of the bit lines, a seventh switch, an eighth switch, a ninth switch and a tenth switch.

The first switches and the second switches are respectively for receiving a first shielding voltage and a second shielding voltage, the third switches and the fourth switches are respectively for receiving a first sensing voltage and a second sensing voltage. The seventh switch is coupled between the first shielding voltage and the first switches corresponding to each of the bit-line groups. The eighth switch is coupled between the second shielding voltage and the second switches corresponding to each of the bit-line groups. The ninth switch is coupled between the first sensing voltage and the third switches corresponding to each of the bit-line groups. The tenth switch is coupled between the second sensing voltage and the fourth switches corresponding to each of the bit-line groups.

According to a fourth aspect of the present invention, a decoding method for a memory is provided. The memory includes at least one memory cell and a number of column lines. The column lines include a first and a second column lines coupled to the memory cell, a third and a fourth column lines successively neighboring the second column line, and a fifth column line spacing from the fourth column with at least one column line. The decoding method includes supplying a ground voltage to the first column line; supplying a first sensing voltage to the second column line; supplying a second sensing voltage to the third column line; supplying a first shielding voltage to the forth column line; and supplying a second shielding voltage to the fifth column line.

The invention will become apparent from the following detailed description of the preferred but non-limiting embodiments. The following description is made with reference to the accompanying drawings.

DETAILED DESCRIPTION OF THE INVENTION

In order to effectively solve the typical array-effect issue, the invention supplies a first sensing voltage to the column line of the memory cell to be read, successively supplies a second sensing voltage and a first shielding voltage, both equal to the first sensing voltage, to the column lines of the next two memory cells, allows the column line of at least one following memory cell to float, and supplies a second shielding voltage, equal to the first shielding voltage, to the column line of the memory cell next to the at least one following memory cell in a read operation. Therefore, the array effect can be cancelled to widen the cell operating window and increase the cell program speed of the memory.

Figure 1:
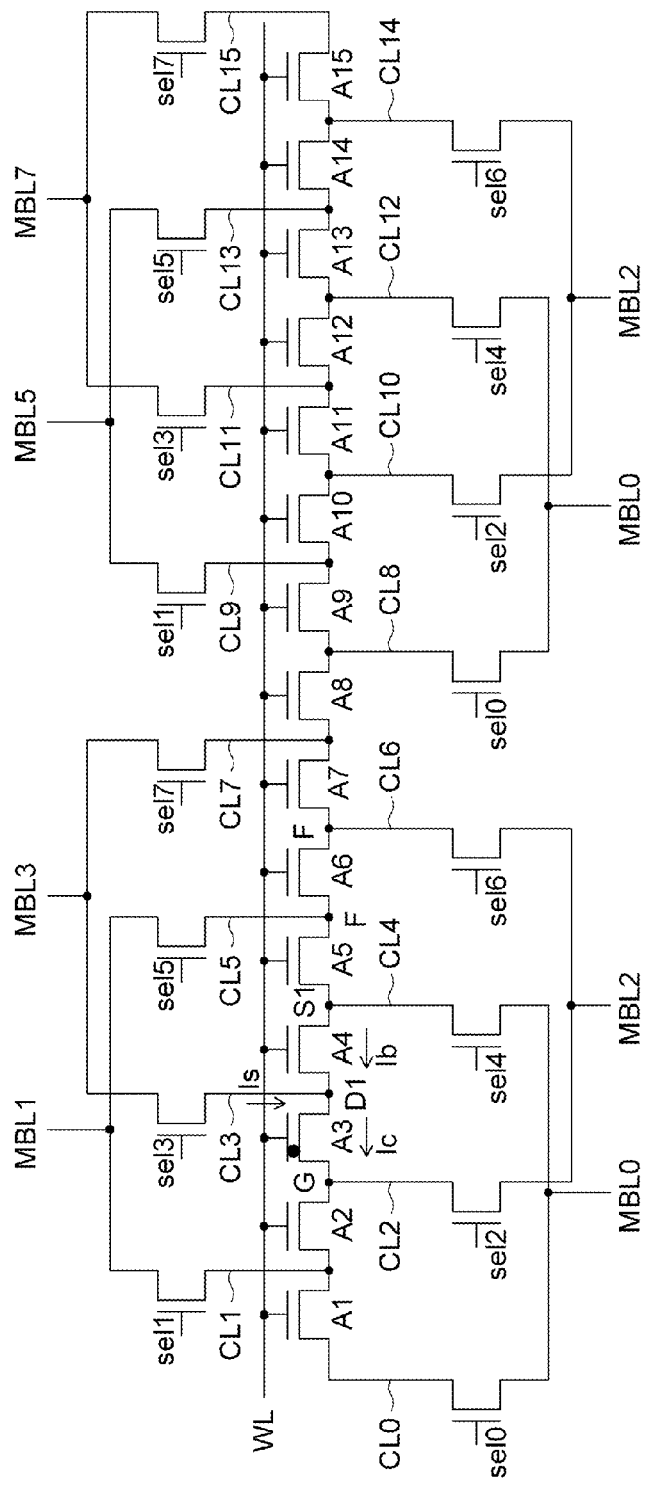
FIG. 1 is a schematic diagram of a sensing algorithm of memory cells in a conventional non-volatile memory.
Figure 2:
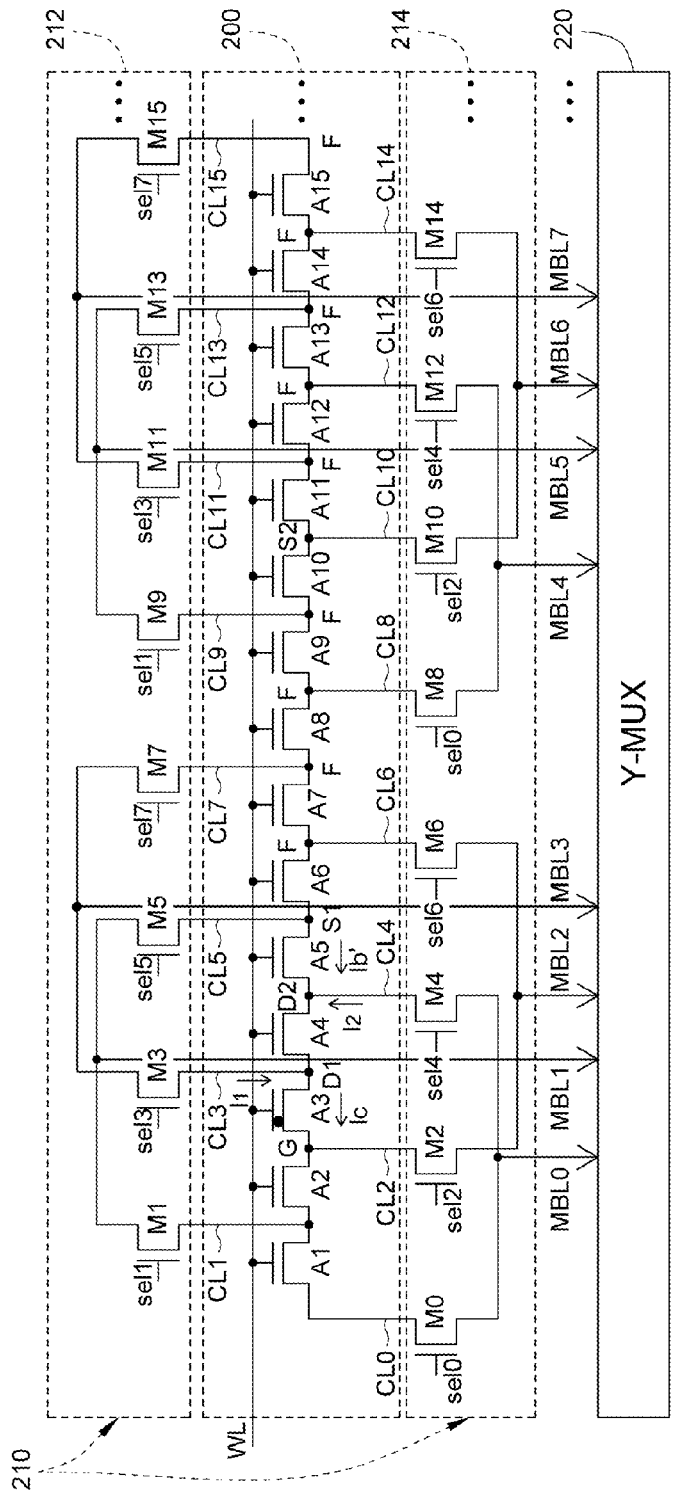
FIG. 2 is a schematic circuit diagram of a Y-decoder according to a preferred embodiment of the invention.

Referring to FIG. 2, a schematic circuit diagram of a Y-decoder according to a preferred embodiment of the invention is shown. The Y-decoder in the embodiment is applied in a non-volatile memory. The memory includes a memory array (or called a virtual ground array) 200. The memory array 200 includes a number of memory cells composed of MOS transistors and a number of word lines and column lines coupled to the memory cells. In FIG. 2, only memory cells A1~A15, column lines CL0~CL15 and a word line WL coupled to the memory cells A1~A15 in one memory bank are shown for illustration convenience.

Supposed the cell A3 (specifically, the left bit of the cell A3) is to be read, the related column lines of the memory array 200 (in the same memory bank) include a first column line CL2, a second column line CL3, a third column line CL4 and a fourth column line CL5 arranged successively from CL2 to CL5, and a fifth column line CL10 spacing from the fourth column line with at least one column line, such as including the four successive column lines CL6~CL9 next to the fourth column line CL5.

The Y-decoder includes a bank selection unit 210 and a Y-multiplexer (Y-MUX) 220. The bank selection unit 210 is coupled to the memory array 200 (specifically, one memory bank of the memory array 200) for selecting the column lines CL0~CL15 via a number of bit lines, such as MBL0~MBL7. The Y-MUX 220 is coupled to the bank selection unit 210 for supplying voltages to the selected column lines CL0~CL15 via the bit lines MBL0~MBL7. The bank selection unit 210 includes an upper bank-select (U-BLT) circuit 212 and a bottom bank-select (B-BLT) circuit 214. The U-BLT circuit includes a number of bank-select MOS transistors, such as M1, M3, . . . , M15, disposed on the top of the memory array 200 and coupled to the odd-numbered column lines CL1, CL3, . . . , CL15. The B-BLT circuit 214 includes a number of bank-select MOS transistors, such as M0, M2, . . . , M14, disposed at the bottom of the memory array 200 and coupled to the even-numbered column lines CL0, CL2, . . . , CL14. Besides, each of the bit lines is coupled to two column lines spaced by three column lines. For example, each bit line MBLi (i=0~3) is coupled to two column lines CLi and CLi+4 spaced by three column lines CLi+1, CLi+2 and CLi+3. Each bit line MBLi (i=4~7) is coupled to two column lines CLi+4 and CLi+8 spaced by three column lines CLi+5, CLi+6 and CLi+7. The bank selection unit 210 selects one column line CLi (i=0~15) from the column lines CL0~CL15 by turning on the corresponding bank-select MOS transistor Mi to couple the selected column line CLi with the corresponding bit line MBL0, . . . , or MBL7.

Figure 3:
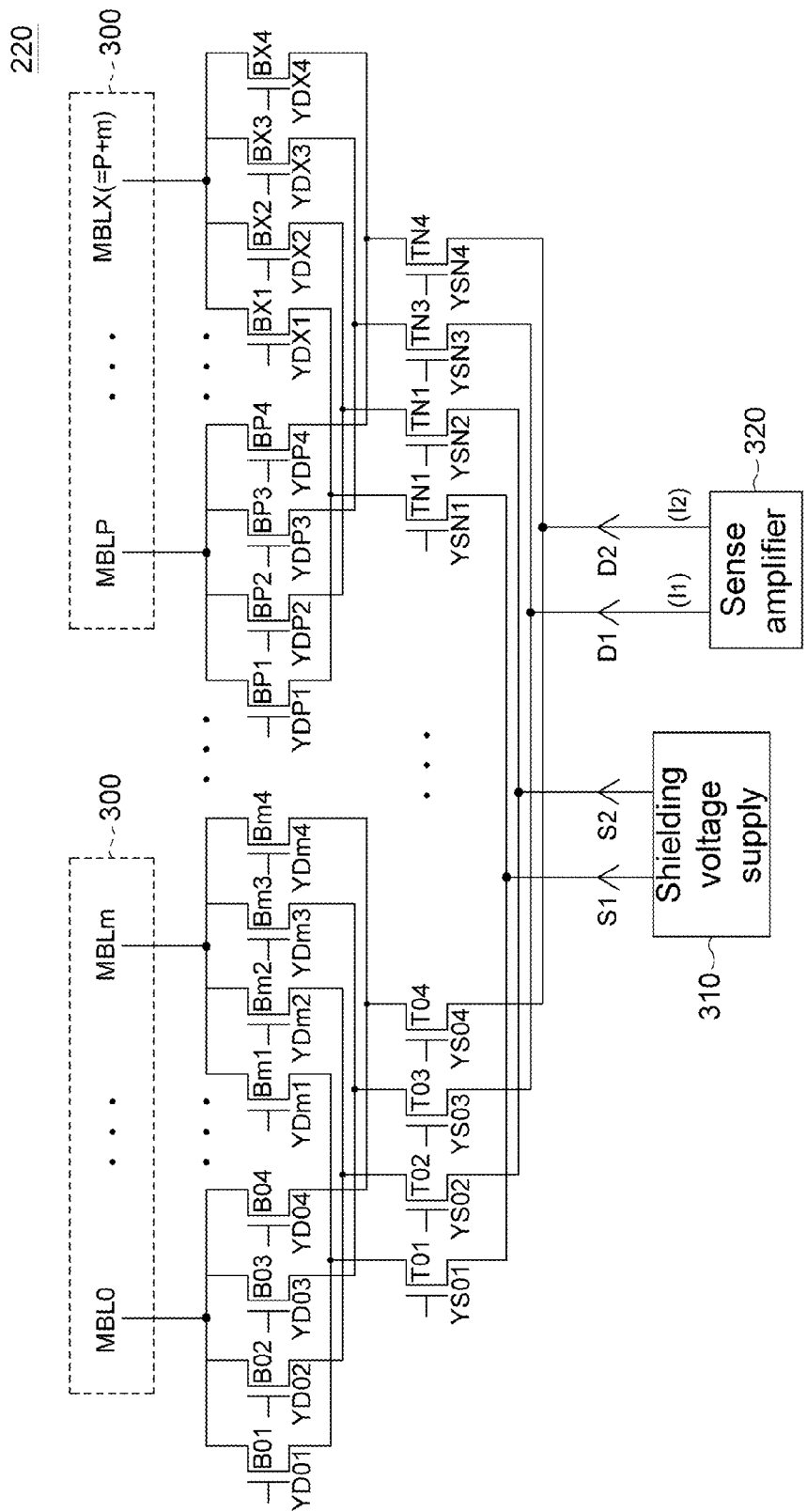
FIG. 3 is a circuit diagram of the Y-MUX in FIG. 2.

Referring to FIG. 3, a circuit diagram of the Y-MUX 220 in FIG. 2 is shown. For example, the bit lines of the memory array 220 are divided into (N+1) bit-line groups 300, and each bit-line group 300 is composed of (m+1) successive bit lines, wherein N, m are positive integers, e.g. N=31, m=7. As shown in FIG. 3, the first bit-line group 300 includes bit lines MBL0~MBLm and the (N+1)-th bit-line group 300 includes bit lines MBLP~MBLX, wherein P=N×(m+1)+1 and X=P+m (e.g. P=249; X=256). The Y-MUX 220 includes a first switch, such as the MOS transistor Bn1, a second switch, such as the MOS transistor Bn2, a third switch, such as the MOS transistor Bn3, and a fourth switch, such as the MOS transistor Bn4, coupled in parallel to the bit line MBLn (n=0~X), wherein the first switches Bn1 and the second switches Bn2 are for respectively receiving a first shielding voltage S1 and a second shielding voltage S2 from a shielding voltage supply 310.

The Y-MUX 220 includes a sense amplifier 320 for respectively supplying a first sensing voltage (or drain voltage) D1 (corresponding to a first sensing current I1) and a second sensing voltage D2 (corresponding to a second sensing current I2) through the third switches Bn3 and the fourth switches Bn4, wherein the first sensing voltage D1, the second sensing voltage D2, the first shielding voltage S1 and the second shielding voltage S2 are controlled to be substantially the same.

The Y-MUX 220 further includes a seventh switch, such as the MOS transistor Tj1, coupled between the first shielding voltage S1 and the first switches Ba1~Bb1 corresponding to the bit-line group 300 of bit lines MBLa~MBLb, an eighth switch, such as the MOS transistor Tj2, coupled between the second shielding voltage S2 and the second switches Ba2~Bb2, a ninth switch, such as the MOS transistor Tj3, coupled between the first sensing voltage D1 and the third switches Ba3~Bb3, and a tenth switch, such as the MOS transistor Tj4, coupled between the second sensing voltage D2 and the fourth switches Ba4~Bb4, wherein a=j×(m+1) and b=(j×(m+1)+m), j is an integer, j=0~N.

Figure 4:
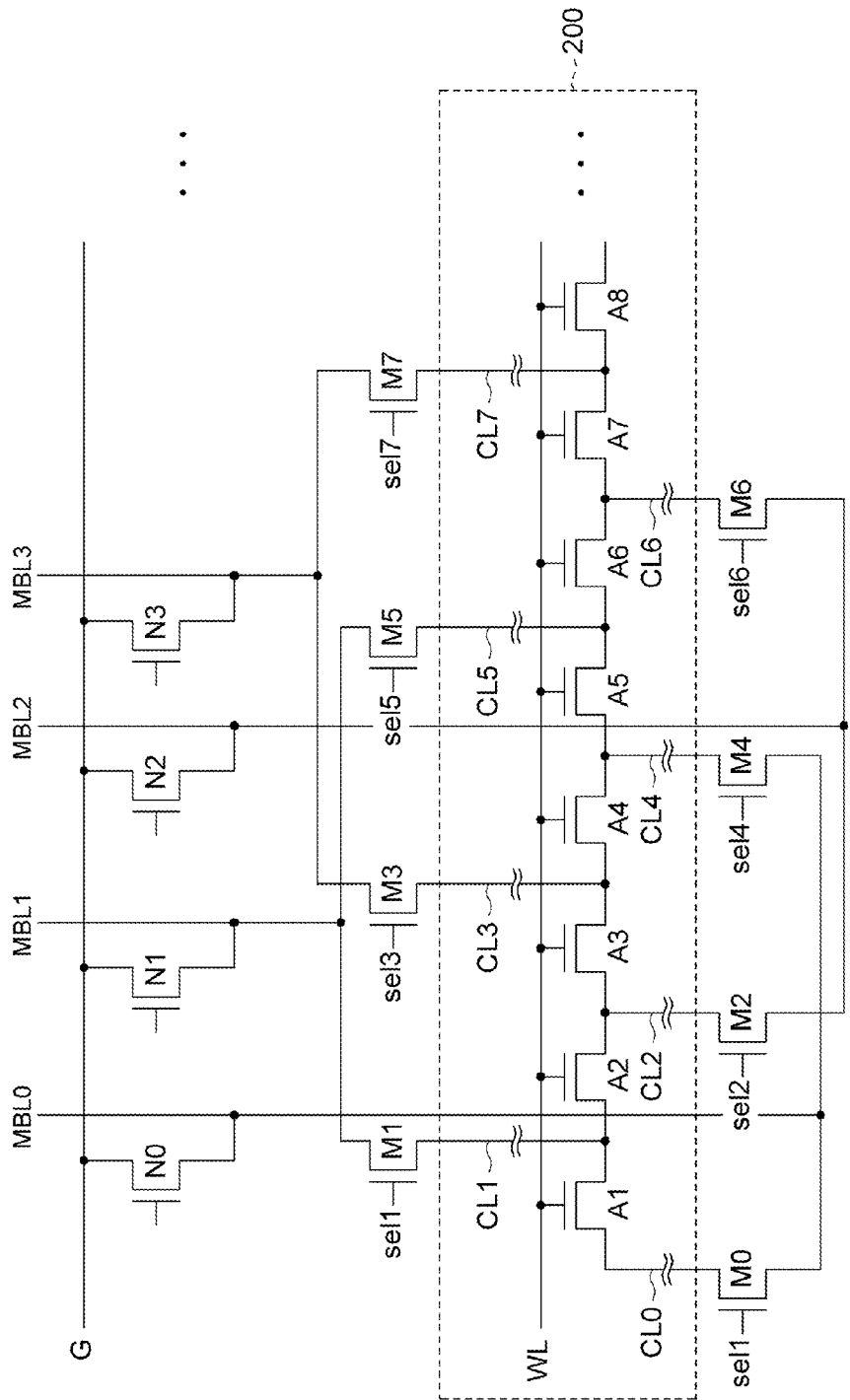
FIG. 4 is a circuit diagram of the switches disposed between a ground voltage and the column lines of the memory cells in FIG. 2.

As shown in FIG. 4, the Y-decoder further includes a fifth switch, such as the MOS transistor Nk, disposed on the top of the memory array 200 and coupled between the metal bit line MBLk, (e.g. k=0~1023) and the ground voltage G, and the Y-decoder supplies the selected metal bit line MBLk with the ground voltage G by turning on the corresponding MOS transistor Nk.

Figure 5:
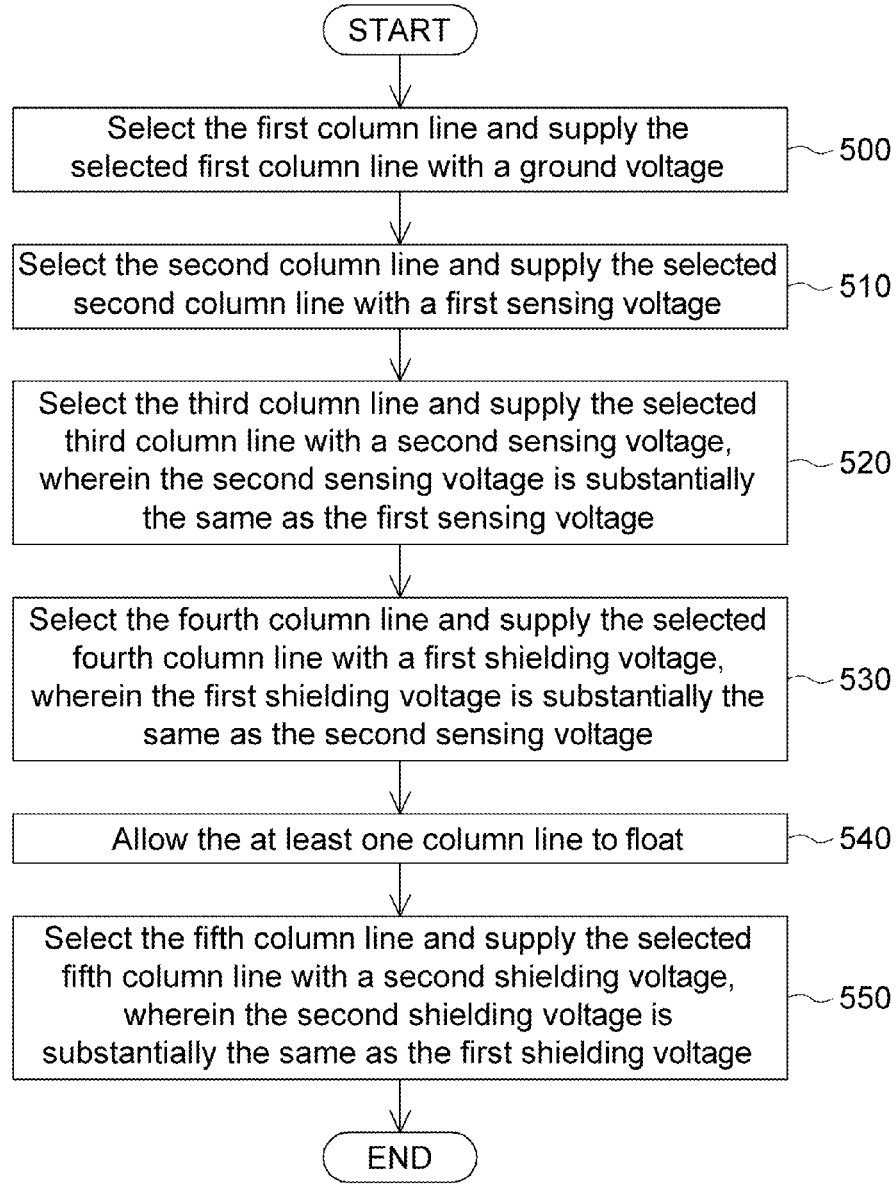
FIG. 5 is a flow chart of a decoding method according to the preferred embodiment of the invention.

Referring to FIG. 5, a flow chart of a decoding method according to the preferred embodiment of the invention is shown. The decoding method is applied to the above Y-decoder as shown in FIG. 2~FIG. 4. First, in step 500, select the first column line and supply the selected first column line with a ground voltage. To ascertain the current drawn by, for example, the memory cell A3 in the read operation, the Y-decoder selects the first column line CL2 coupled to the source of the memory cell A3 by turning on the bank-select MOS transistor M2 and supplies the ground voltage G to the first column line CL2 by turning on the corresponding fifth switch (the transistor N2). Next, in step 510, select the second column line and supply the selected second column line with a first sensing voltage. For example, the Y-decoder selects the second column line CL3 coupled to the drain of the memory cell A3 by turning on the bank-select MOS transistor M3 and supplies the first sensing voltage D1 to the second column line CL3 via the corresponding bit line MBL3 by turning on the corresponding third switch (transistor B33) and ninth switch (transistor T03).

Then, in step 520, select the third column line and supply the selected third column line with a second sensing voltage, wherein the second sensing voltage is substantially the same as the first sensing voltage. For example, the Y-decoder selects the third column line CL4 coupled to the drain of the next memory cell A4 by turning on the bank-select MOS transistor M4 and supplies the second sensing voltage D2 to the third column line CL4 via the corresponding bit line MBL0 by turning on the corresponding fourth switch (transistor B04) and tenth switch (transistor T04).

Following that, in step 530, select the fourth column line and supply the selected fourth column line with a first shielding voltage, wherein the first shielding voltage is substantially the same as the second sensing voltage. For example, the Y-decoder selects the fourth column line CL5 coupled to the drain of the next second cell A5 by turning on the bank-select MOS transistor M5 and supplies the first shielding voltage S1 to the fourth column line CL5 via the corresponding bit line MBL1 by turning on the corresponding first switch (transistor B11) and seventh switch (transistor T01). Then, in step 540, allow the at least one column line between the fourth column line and the fifth column line to float. For example, allows the column lines CL6~CL9 coupled to the drains of the following four successive cells A6~A9 to float by turning off the bank-select MOS transistors M6~M9.

Afterward, in step 550, select the fifth column line and supply the selected fifth column line with a second shielding voltage, wherein the second shielding voltage is substantially the same as the first shielding voltage. For example, the Y-decoder selects the fifth column line CL10 next to the at least one column line and coupled to the drain of the memory cell A10 by turning on the bank-select MOS transistor M10, and supplies the second shielding voltage S2 to the fifth column line CL10 via the corresponding bit line MBL6 by turning on the corresponding second switch (transistor B62) and eighth switch (transistor T02).

The drains of the following memory cells A11~A13 are controlled to float (F) by turning off the MOS transistors B41~B44, B51~B54 and B71~B74, and the drains of the memory cells A14 and A15 are controlled to float by turning off the bank-select MOS transistors M14 and M15. Also, the drains of the memory cells corresponding to the following bit-line groups 300 are controlled to float by turning off the corresponding seventh to tenth switches (the transistors Tj1~Tj4, j=1~N).

By the above design, the bypass current Ib' flowing by the memory cell A5 can be very smaller than the bypass current Ib of the prior-art memory, and the cell current Ic of the memory cell A3 can be close to the sensing current (Is), which is equal to a sum of a sensing current I1 flowing by the second column line CL3 (corresponding to the first sensing voltage D1) and a sensing current I2 flowing by the third column line CL4 (corresponding to the second sensing voltage D2) to the sense amplifier 320, i.e. Ic~Is=(I1+I2). Therefore, the prior-art array effect of the memory can be cancelled to widen the cell operating window and increase the cell program speed of the memory.

Although the drain of the memory cell A11 next to the memory cell A10 supplied with the second shielding voltage S2 is exemplified to float in the above embodiment, the Y-MUX 220 of the invention can further include a sixth switch (such as a MOS transistor) coupled to each of the bit lines MBL0~MBLX and an eleventh switch coupled between the shielding voltage supply 310 and the sixth switches corresponding to each bit line group 300. When the memory cell A3 is to be read, the column line CL11 is also selected by turning on the bank-select MOS transistor M11 and a third shielding voltage is supplied to the selected column line CL11 via the corresponding bit line MBL7 by turning on the corresponding sixth switch, wherein the third shielding voltage is substantially the same as the second shielding voltage S2. That is, the above decoding method can further include selecting the column line CL11 next to the fifth column line CL10 and supply the selected column line CL11 with a third shielding voltage.

Besides, as mentioned above, the bit lines are divided into a number of bit-line groups 300 and each bit-line group is composed of (m+1) successive bit lines. The step 510 of supplying the selected second column line CL3 with the first sensing voltage D1 further includes selecting the bit-line group 300 of bit lines MBL0~MBLm corresponding to the second column line CL3 by turning on the MOS transistor T03 in the group of transistors T01~T04 and turning off other groups of transistors Tj1~Tj4 (j=1~N) and selecting the bit line MBL3 coupled to the second column line CL3 from the selected bit-line group 300 for supplying the first sensing voltage D1 by turning on the MOS transistor B33 in the group of transistors B31~B34 and turning off other groups of transistors Bi1~Bi4 (i=0, 1, 2, 4, . . . m).

The step 520 of supplying the selected third column line CL4 with the second sensing voltage D2 further includes selecting the bit-line group 300 of bit lines MBL0~MBLm corresponding to the third column line CL4 by turning on the MOS transistor T04 in the group of transistors T01~T04 and turning off other groups of transistors Tj1~Tj4 (j=1~N) and selecting the bit line MBL0 coupled to the third column line CL4 in the selected bit-line group 300 for supplying the second sensing voltage D2 by turning on the MOS transistor B04 in the group of transistors B01~B04 and turning off other groups of transistors Bi1~Bi4 (i=1~m).

The step 530 of supplying the selected fourth column line CL5 with the first shielding voltage S1 further includes selecting the bit-line group 300 of bit lines MBL0~MBLm corresponding to the fourth column line CL5 by turning on the MOS transistor T01 in the group of transistors T01~T04 and turning off other groups of transistors Tj1~Tj4 (j=1~N) and selecting the bit line MBL1 coupled to the fourth column line CL5 in the selected bit-line group 300 for supplying the first shielding voltage S1 by turning on the MOS transistor B11 in the group of transistors B11~B14 and turning off other groups of transistors Bi1~Bi4 (i=0, 2, . . . m).

The step 550 of supplying the selected fifth column line CL10 with the second shielding voltage S2 further includes selecting the bit-line group 300 of bit lines MBL0~MBLm corresponding to the fifth column line CL10 by turning on the MOS transistor T02 in the group of transistors T01~T04 and turning off other groups of transistors Tj1~Tj4 (j=1~N) and selecting the bit line MBL6 coupled to the fifth column line CL10 in the selected bit-line group 300 for supplying the second shielding voltage S2 by turning on the MOS transistor B62 in the group of transistors B61~B64 and turning off other groups of transistors Bi1~Bi4 (i=0, . . . , 5, 7, . . . m).

The Y-decoder and decoding method disclosed by the above embodiment of the invention supplies a first sensing voltage to the column line of the memory cell to be read, successively supplies a second sensing voltage and a first shielding voltage, both equal to the first sensing voltage, to the column lines of the next two memory cells, allows the column line of at least one following memory cell to float and supplies a second shielding voltage, equal to the first shielding voltage, to the column line of the memory cell next to the at least one following memory cell in a read operation. Therefore, the array effect of the virtual ground array (200) can be cancelled to improve the cell operating window and the program speed.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
a first column line and a second column line coupled to a memory cell;
a third column line, spacing from the second column line with at least one column line; wherein when the memory cell is to be read, a decoder selects and supplies the first column line with a ground voltage, selects and supplies the second column line with a first sensing voltage, allows the at least one column line to float, and selects and supplies the third column line with a first shielding voltage; and
a fourth column line and a fifth column line arranged successively next to the second column line, and when the memory cell is to be read, the decoder selects and supplies the fourth column line with a second sensing voltage, and selects and supplies the fifth column line with a second shielding voltage.

2. The memory device according to claim 1, wherein the first sensing voltage, the second sensing voltage, the first shielding voltage and the second shielding voltage are substantially the same.

3. The memory device according to claim 1, wherein the at least one column line comprises four successive column lines next to the fifth column line.

4. The memory device according to claim 1, wherein the decoder further comprises a first switch, a second switch, a third switch and a fourth switch coupled in parallel, wherein the first switch and the second switch are respectively for receiving the second shielding voltage and the first shielding voltage, the third switch and the fourth switch are respectively for receiving the first sensing voltage and the second sensing voltage.

5. The memory device according to claim 4, further comprising a plurality of bit lines coupled to the column lines, and a plurality of fifth switches correspondingly coupled to the bit lines and the ground voltage, wherein the decoder supplies the selected column line with the ground voltage by turning on the corresponding fifth switch.

6. The memory device according to claim 5, wherein the fifth switches are disposed on the top of a memory array comprising the memory cell.

7. The memory device according to claim 6, further comprising a plurality of select MOS transistors disposed on the top of the memory array and coupled to the odd-numbered column lines and a plurality of select MOS transistors disposed at the bottom of the memory array and coupled to the even-numbered column lines.

8. The memory device according to claim 7, wherein each of the bit lines is coupled to two column lines spaced by three column lines and the decoder selects one column line from the column lines by turning on the corresponding select MOS transistor to couple the selected column line with the corresponding bit line.

9. The memory device according to claim 5, wherein the bit lines are divided into a plurality of bit-line groups, each composed of the same number of successive bit lines, the decoder further comprises a sixth switch coupled between the second shielding voltage and the first switches corresponding to each bit-line group, a seventh switch coupled between the first shielding voltage and the second switches corresponding to each bit-line group, an eighth switch coupled between the first sensing voltage and the third switches corresponding to each bit-line group, and a ninth switch coupled between the second sensing voltage and the fourth switches corresponding to each bit-line group.

10. The memory device according to claim 1, wherein when the first column line is selected and supplied with the ground voltage, the column line located next to the third column line is selected and supplied with a third shielding voltage, and the third shielding voltage is substantially the same as the first shielding voltage.

11. A decoding method for a memory device, the memory device comprising a first column line and a second column line coupled to a memory cell, a third column line spacing from the second column line with at least one column line and a fourth column line and a fifth column line arranged successively next to the second column line, the decoding method comprising:
supplying a ground voltage to the first column line;
supplying a first sensing voltage to the second column line;

supplying a first shielding voltage to the third column line; and supplying a second sensing voltage to the fourth column line; and supplying a second shielding voltage to the fifth column line.

12. The decoding method according to claim 11, further comprising allowing the at least one column line to float.

13. The decoding method according to claim 11, wherein the first sensing voltage, the second sensing voltage, the first shielding voltage and the second shielding voltage are substantially the same.

14. The decoding method according to claim 11, wherein the at least one column line comprises four successive column lines next to the fifth column line.

15. The decoding method according to claim 11, further comprising selecting a column line next to the third column line and supplying the selected column line with a third shielding voltage which is substantially the same as the first shielding voltage.

16. The decoding method according to claim 11, wherein the memory device further comprises a plurality of bit lines coupled to the column lines, the bit lines are divided into a plurality of bit-line groups, each composed of the same number of successive bit lines;

the step of supplying a first sensing voltage to the second column line further comprises selecting the bit-line group corresponding to the second column line and selecting the bit line coupled to the second column line in the selected bit-line group for supplying the first sensing voltage; and the step of supplying a first shielding voltage to the third column line further comprises selecting the bit-line group corresponding to the third column line and selecting the bit line coupled to the third column line in the selected bit-line group for supplying the first shielding voltage.

* * * * *